(12) United States Patent
Remaklus, Jr. et al.

(10) Patent No.: US 7,586,805 B2
(45) Date of Patent: *Sep. 8, 2009

(54) METHOD AND SYSTEM FOR PROVIDING DIRECTED BANK REFRESH FOR VOLATILE MEMORIES

(75) Inventors: Perry Willmann Remaklus, Jr., Raleigh, NC (US); Robert Michael Walker, Raleigh, NC (US)

(73) Assignee: QUALCOMM Incorporated, San Diego, CA (US)

( * ) Notice: Subject to any disclaimer, the term of this patent is extended or adjusted under 35 U.S.C. 154(b) by 291 days.

This patent is subject to a terminal disclaimer.

(21) Appl. No.: 11/374,838

(22) Filed: Mar. 14, 2006

(65) Prior Publication Data

US 2007/0242544 A1    Oct. 18, 2007

Related U.S. Application Data

(63) Continuation of application No. 10/982,038, filed on Nov. 5, 2004, now Pat. No. 7,079,440.

(60) Provisional application No. 60/575,334, filed on May 27, 2004.

(51) Int. Cl.
    *G11C 7/00*    (2006.01)
(52) U.S. Cl. .............. 365/222; 365/230.03; 365/230.08
(58) Field of Classification Search ................ 365/222, 365/230.03, 230.08
    See application file for complete search history.

(56) References Cited

U.S. PATENT DOCUMENTS

| | | | | |
|---|---|---|---|---|
| 5,627,791 A | * | 5/1997 | Wright et al. | 365/222 |
| 5,796,669 A | * | 8/1998 | Araki et al. | 365/222 |
| 6,233,192 B1 | * | 5/2001 | Tanaka | 365/222 |
| 6,285,616 B1 | * | 9/2001 | Ikabata | 365/222 |
| 6,310,814 B1 | * | 10/2001 | Hampel et al. | 365/222 |
| 6,563,757 B2 | * | 5/2003 | Agata | 365/222 |
| 6,859,407 B1 | * | 2/2005 | Suh | 365/222 |
| 7,079,440 B2 | | 7/2006 | Remaklus et al. | |
| 7,088,633 B2 | * | 8/2006 | Remaklus et al. | 365/222 |
| 7,184,350 B2 | * | 2/2007 | Remaklus et al. | 365/222 |

(Continued)

FOREIGN PATENT DOCUMENTS

WO    97030453    8/1997

(Continued)

OTHER PUBLICATIONS

International Preliminary Report on Patentability-PCT/US05/018903, the International Bureau of WIPO, Geneva Switzerland-Nov. 29, 2006.

(Continued)

*Primary Examiner*—Huan Hoang
(74) *Attorney, Agent, or Firm*—Nicholas J. Pauley; Peter M. Kamarchik; Sam Talpalatsky

(57) ABSTRACT

A memory system is provided. The memory system includes a volatile memory having a number of banks and a memory controller configured to control the volatile memory to engage in an auto-refresh mode or a self-refresh mode. The memory controller is further configured to direct the volatile memory to perform an auto-refresh operation on a target bank. The remaining banks are available for access while the auto-refresh operation is being performed on the target bank.

25 Claims, 2 Drawing Sheets

U.S. PATENT DOCUMENTS

| | | | | |
|---|---|---|---|---|
| 7,236,416 B2 * | 6/2007 | Walker | ................... | 365/222 |
| 2007/0121409 A1 * | 5/2007 | Remaklus Jr. et al. | ....... | 365/222 |

FOREIGN PATENT DOCUMENTS

| WO | 02082455 | 10/2002 |
|---|---|---|

OTHER PUBLICATIONS

International Search Report-PCT/US05/018903, International Search Authority-European Patent Office-Oct. 28, 2005.

Written Opinion PCT/US05/018903, International Search Authority-European Patent Office-Oct. 28, 2005.

* cited by examiner

METHOD AND SYSTEM FOR PROVIDING DIRECTED BANK REFRESH FOR VOLATILE MEMORIES

RELATED APPLICATIONS

The present application claims priority from and is a continuation of U.S. patent application Ser. No. 10/982,038, filed Nov. 5, 2004, and issued as U.S. Pat. No. 7,079,440, which claims priority to U.S. Provisional Application No. 60/575,334, filed May 27, 2004. The contents of U.S. patent application Ser. No. 10/982,038 and U.S. Provisional Application No. 60/575,334 are expressly incorporated herein by reference in their entirety.

BACKGROUND

1. Field

The present disclosure relates generally to memory devices, and more specifically, to methods and systems for providing directed bank refresh for volatile memories.

2. Background

Volatile memory is a storage medium that is generally structured as a number of arrays (or banks). Each bank is further arranged as a matrix of "memory cells" in rows and columns, with each column being further divided by the input/output (I/O) width of the memory. Locations within the memory are uniquely specified by bank, row and column. A memory controller may be used to retrieve data from the memory by indicating the data's bank, row and column location. For example, for a quad-bank 128 Mb memory with a 16-bit external data bus, a possible logical address mapping includes a 9-bit column address, a 2-bit bank address and a 12-bit row address.

Prior to reading or writing a memory location, the corresponding row must first be opened. The process of opening a row requires a minimum number of clock cycles, $t_{RCD}$, which represents the row-to-column delay. Once a row is open, column addresses within that row can be read or written as desired. For some dynamic random access memories (DRAMs), such as synchronous DRAMs (SDRAMs), only one row per bank can be kept open at any one time; a subsequent memory access to be performed within the same bank but at a different row requires closing the current row and opening the new one.

In the case of dynamic volatile memories, each cell must be refreshed, or re-energized, periodically at an average interval, $t_{REF1}$, in order to maintain data integrity. The cells have to be refreshed because they are designed around capacitors that store electrical charges, which may discharge over time. Refresh is the process of recharging the cells in memory. Cells are generally refreshed one row at a time. A number of methods currently exist that are designed to refresh volatile memories. Some, if not all, of these methods incur high cost in performance and/or power. For example, there are two common methods or techniques that are generally used to control the refresh of volatile memories in modern digital systems. One method relies on the memory to keep track of the row and bank(s) that need to be refreshed using built-in refresh mechanisms that are available on the memory; the other method relies on the memory controller to keep track of the row and bank that need to be refreshed.

The first commonly used method is utilized by the auto-refresh and self-refresh functions of the volatile memories. These functions use the built-in refresh address of the memory. During active use of the memory, when a refresh cycle is required, the memory controller precharges all the banks, and then uses the auto-refresh command to tell the memory to issue an internal refresh cycle. Upon receiving the auto-refresh command, the memory increments the internal refresh address counter and executes the internal refresh cycle. In auto-refresh mode, the memory uses the refresh address in its internal refresh address counter to determine which rows/banks to perform the refresh cycle and cycle through the relevant rows. In one implementation, the internal refresh address counter includes a row address register and a bank address register. The bank address register is incremented to cycle through each of the memory banks with the carry-out of the bank address register causing the row address register to increment. Other implementations do not have a bank address register as all banks are simultaneously refreshed.

A disadvantage of present non-simultaneous bank auto-refresh implementations is that because the memory controller does not know which internal bank will be refreshed, the memory controller is required to close all open rows in each bank prior to issuing an auto-refresh command. As a result, the memory data bus availability during an auto-refresh sequence is zero. At best, this sequence requires $t_{RP}+t_{RFC}+t_{RCD}$ cycles, where $t_{RP}$ represents a row-precharge delay, $t_{RFC}$ represents the refresh cycle time and $t_{RCD}$ represents the row-to-column delay. For a 133 MHz memory, this could be 16 clock cycles (120 ns). These cycles are sometimes referred to as dead cycles since the memory data bus is not available during this period.

During periods of non-use, the memory controller may place the memory in the self-refresh mode. In the self-refresh mode, the memory uses its own internal clock and refresh address counter to generate refreshes to refresh the row(s) of the memory. This method is good for saving power during idle states since the self-refresh mode can be used. The self-refresh state uses a small amount of power and maintains the contents of the memory by refreshing the memory. Due to the small amount of power needed, this method is typically used for low power applications.

A second method is sometimes used to avoid the dead cycles on the memory data bus mentioned above. According to this second method, control of the refresh is effected via the memory controller. This method does not use any of the built-in refresh mechanisms that are available on the memory. Under this method, at regularly given intervals ($t_{REF1}$), the memory controller explicitly generates refreshes by opening and closing rows in a sequential manner using bank/row address combinations. The refresh clock, which determines the refresh rate, and the bank/row address combinations are internal to the memory controller. This method is best for high speed/high performance applications. This method allows the memory controller to refresh a particular memory bank while permitting other memory banks to remain open for access, resulting in higher performance; reads and writes to other banks can generally continue in parallel and uninterrupted. The downside to this method is that during system power down or long idle states, when the memory controller is not refreshing the memory, the memory cannot be kept in a self-refresh state. As mentioned above, the self-refresh state is a built-in function of most volatile memories. Since the self-refresh function of the memory increments a refresh address (i.e., the row/bank address) stored in a refresh address counter in the memory, independent of the memory controller, the refresh address maintained by the memory is not consistent or synchronized with the memory controller.

Refresh operations can reduce performance of memory because each refresh cycle forces the memory into an idle state, during which data access is not available. For example, if a refresh cycle is required for a particular memory bank while such bank is in an active state, the bank has to be shut down to allow the refresh operation to take place. Shutting down the bank means that whatever data operations that were to be performed have to be delayed, hence, affecting system performance.

Some existing schemes are available to reduce the performance impact of refresh operations. Such schemes typically involve using a higher than required refresh rate, so that more memory banks can be refreshed within a predetermined refresh period. By having more memory banks refreshed, the chances of having to shut down an active memory bank for refresh are reduced. Using a higher refresh rate, however, has its drawbacks. For example, an increase in refresh rate means memory becomes unavailable for access more often which, in turn, results in lower performance. Also, merely using a higher refresh rate does not always obviate the need to shut down an active memory bank when refresh is required; in some situations, an active memory bank has to be shut down regardless, thus, negating any benefits from using a higher refresh rate.

Hence, it would be desirable to provide more efficient methods and systems for providing directed bank refresh for volatile memories.

SUMMARY

One aspect of a memory system is disclosed. The memory system includes a volatile memory capable of operating in an auto-refresh mode and a self-refresh mode, the volatile memory having a plurality of banks. The memory system also includes a memory controller configured to provide a target bank address to each of the banks to perform an auto-refresh operation on the target bank, while the other banks remain available for access.

Another aspect of a memory system is disclosed. The memory system includes a volatile memory capable of operating in an auto-refresh mode and a self-refresh mode, the volatile memory having a plurality of banks and a single refresh counter configured to provide a row address to each of the banks during an auto-refresh operation. The memory system also includes a memory controller configured to direct the volatile memory to perform an auto-refresh operation on a target bank, while the other banks remain available for access.

It is understood that other embodiments of the present invention will become readily apparent to those skilled in the art from the following detailed description, wherein various embodiments of the invention are shown and described by way of illustration. As will be realized, the invention is capable of other and different embodiments and its several details are capable of modification in various other respects, all without departing from the spirit and scope of the present invention. Accordingly, the drawings and detailed description are to be regarded as illustrative in nature and not as restrictive.

BRIEF DESCRIPTION OF THE DRAWINGS

Aspects of the present invention are illustrated by way of example, and not by way of limitation, in the accompanying drawings, wherein.

DETAILED DESCRIPTION

The detailed description set forth below in connection with the appended drawings is intended as a description of various embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention.

Figure 1:
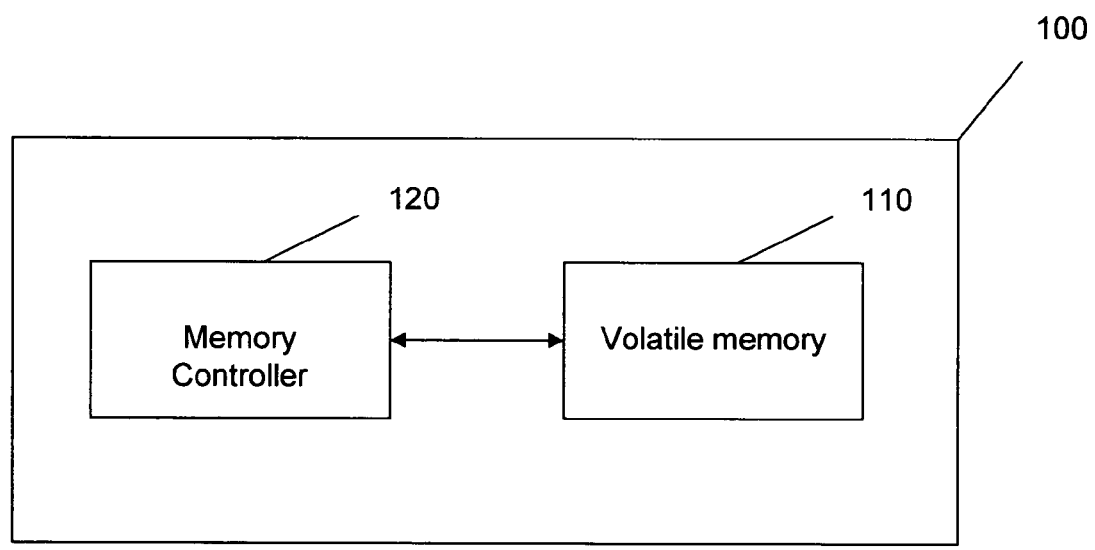
FIG. 1 is a simplified block diagram illustrating an arrangement that can be used to practice the directed refresh method according to the present disclosure.

Various embodiments of a memory system will now be described. In one embodiment, a directed refresh method is provided which improves data availability in a memory during refresh operations. FIG. 1 shows an arrangement 100 that can be used to practice the directed refresh method. As shown in FIG. 1, the directed refresh method may be practiced with a volatile memory 110 and a controller 120 configured to control the volatile memory 110. The volatile memory 110 can be, for example, a DRAM (dynamic random access memory), a SDRAM (synchronous DRAM), and various other types of DRAM, etc. Based on the disclosure and teachings provided herein, a person of ordinary skill in the art will appreciate how to practice the concepts associated with the present disclosure with other types of memories which require refresh operations. The directed refresh method may be effected via control logic or a processor (not shown) which controls the memory controller 120 and the volatile memory 110. It should be understood that the control logic or processor may be implemented as an independent module or integrated as part of another component, such as, the memory controller 120.

Figure 2:
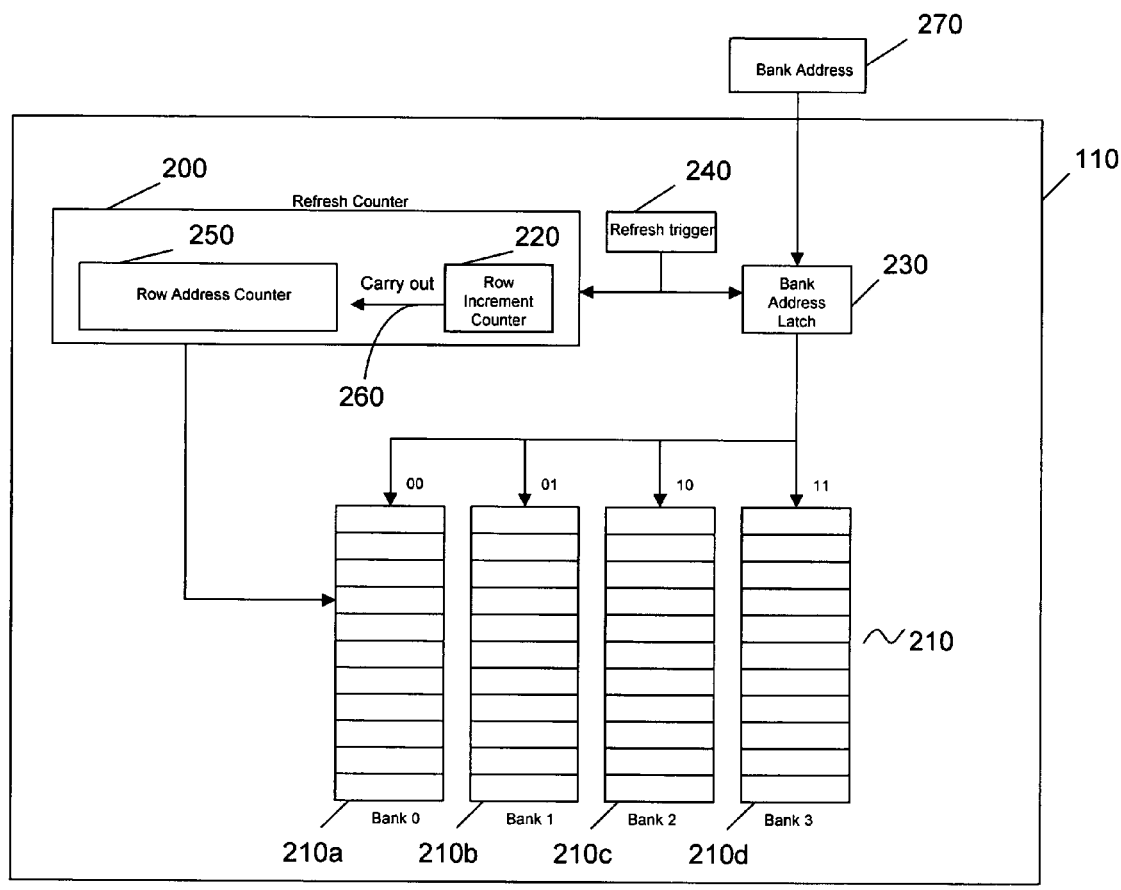
FIG. 2 is a simplified block diagram illustrating a volatile memory that can be used to practice the directed refresh method according to the present disclosure.

FIG. 2 further shows one embodiment of the volatile memory 110 that can be used to practice the directed refresh method. The volatile memory 110 may further include a refresh counter 200 having a row address counter 250 and a row increment counter 220, a refresh trigger 240, a bank address latch 230 and a number of banks 210.

The refresh trigger 240 may be used to control both the refresh counter 200 and the bank address latch 230. The refresh trigger 240 is used by the volatile memory 110 to initiate a refresh operation either in the auto-refresh mode or self-refresh mode. For example, upon receiving an auto-refresh command from the memory controller 120 (see FIG. 1), the volatile memory 110 may direct the refresh trigger 240 to initiate the auto-refresh operation. The refresh trigger 240 can be, for example, a clock or other timing mechanisms.

The row address counter 250 may be used to store the target row address for the row that is to be refreshed. The bank address latch 230 may be used to store the target bank address for the specific bank containing the row that is to be refreshed.

The memory controller 120 may direct the volatile memory 110 to auto-refresh a specific memory bank within the volatile memory 110 while other memory banks remain available for access. For each auto-refresh cycle initiated by the memory controller 120, the bank address 270 may be loaded by the memory controller 120 (see FIG. 1) into the bank address latch 230. The bank address 270 is used to select one of the banks 210 for refresh. Because the memory controller 120 (see FIG. 1) is aware of the specific bank to be refreshed, access to the other internal banks may continue without interruption. This tends to maximize the memory data bus utilization, reduces power consumption by avoiding unnecessary row close/open sequences, and serves to minimize transfer latency.

The row increment counter 220 may be initialized upon power-up or reset. The initialized value for the row increment counter 220 can be arbitrary. The row increment counter 220 causes the row address counter 250 to be incremented after a predetermined number of auto-refresh operations have been performed. The row address counter 250 contains the target row address for a row that is to be refreshed. The row address counter 250 points to the same row in all the banks 210.

The memory controller 120 initiates each auto-refresh cycle by issuing an auto-refresh command to the volatile memory 110 and loading the bank address 270 for the bank to be refreshed into the bank address latch 230. Upon receiving the auto-refresh command, the volatile memory 110 uses the refresh trigger 240 to initiate each auto-refresh operation. The refresh trigger 240 causes the row increment counter 220 to increment. Cyclically, the row address counter 250 is incremented by a carry-out signal 260 from the row increment counter 220. For example, the row increment counter 220 may be a 2-bit counter, which means the row increment counter 220 repeats itself every four (4) refresh clock cycles; conversely, the row address counter 250 is incremented after every 4th auto-refresh operation. The target row address stored in the row address counter 250 and the bank address 270 stored in the bank address latch 230 are then used to refresh a specific row in the identified bank.

Since the target row address changes periodically based on the predetermined number of auto-refresh operations and the memory controller 120 does not know when the row address counter 250 will be incremented, the memory controller 120 (see FIG. 1) issues auto-refresh commands in a consistent, sequential order with respect to the banks 210; in other words, the memory controller 120 loads the bank addresses of the banks 210 into the bank address latch 230 one at a time in a sequential manner during each auto-refresh cycle. As a result, the banks 210 are refreshed sequentially in successive auto-refresh cycles. For example, for the four (4) banks shown in FIG. 2, the refresh bank order could be either "3-2-1-0-3-2-1-0" or "0-1-2-3-0-1-2-3". One order does not have an advantage over the other. Therefore, either one can be used. In one implementation, the sequence "0-1-2-3-0-1-2-3-..." may be used. As will be further described below, choosing this sequence simplifies the transition into self-refresh mode.

The operation of the volatile memory 110 as shown in FIG. 2 is further illustrated in an example as follows. In this example, the initial value in the row increment counter 220 is assumed to be zero (0) and the carry-out signal 260 of the row increment counter 220 is activated after every 4th auto-refresh operation. The memory controller 120 (see FIG. 1) issues an auto-refresh command to the volatile memory 110 and loads the bank address 270 for the bank 210a into the bank address latch 230 to initiate a first auto-refresh cycle. Upon receiving the auto-refresh command, the volatile memory 110 directs the refresh trigger 240 to initiate an auto-refresh operation. During the auto-refresh operation, the row increment counter 220 is incremented to a value of one (1). In this instance, the carry-out signal 260 is not activated and the row address counter 250 is not incremented. The target row address and the bank address currently stored in the row address counter 250 and the bank address latch 230 respectively are then used to refresh a specific row in the bank 210a.

Subsequently, the memory controller 120 (see FIG. 1) issues another auto-refresh command to the volatile memory 110 and loads the bank address 270 for the bank 210b into the bank address latch 230 to initiate a second auto-refresh cycle. Similarly, upon receiving the second auto-refresh command, the volatile memory 110 directs the refresh trigger 240 to initiate another auto-refresh operation. During this auto-refresh operation, the row increment counter 220 is incremented to a value of two (2). Again, the carry-out signal 260 is not activated and the row address counter 250 is not incremented. The target row address and the bank address currently stored in the row address counter 250 and the bank address latch 230 respectively are then used to refresh a specific row in the bank 210b. It should be noted that since the row address counter 250 is not incremented, the target row address used in this auto-refresh operation is the same as the one used in the last auto-refresh operation. However, for this auto-refresh operation, the bank address stored in the bank address latch 230 is different in that a different bank 210b is identified. As a result, the same row in a different bank 210b (as opposed to bank 210a) is refreshed.

Similarly, it will be appreciated that for the 3d and 4th auto-refresh cycles, the row address counter 250 is not incremented (since the carry-out signal 260 of the row increment counter 220 is not activated). Consequently, the same row in different banks 210c and 210d are refreshed during the 3d and 4th auto-refresh cycles.

For the 5th auto-refresh cycle, the bank address 270 loaded by the memory controller 120 (see FIG. 1) into the bank address latch 230 points back to the bank 210a. Furthermore, the carry-out signal 260 of the row increment counter 220 is now activated since four (4) auto-refresh operations have already been performed. The carry-out signal 260, in turn, increments the row address counter 250 thereby moving the target row address to a new row for refresh. This same new row is then refreshed for all four (4) banks 210 during successive auto-refresh cycles.

When the volatile memory 110 is commanded into self-refresh mode, the volatile memory 110 begins to generate refreshes internally using the bank address currently stored in the bank address latch 230 from the point where the memory controller 120 left off issuing the last auto-refresh command to the volatile memory 110. This is rendered possible because, as previously mentioned, the memory controller 120 issues auto-refresh commands in a sequential manner.

Subsequently, following each refresh in self-refresh mode, the output of the bank address latch 230 is incremented. In effect, the bank address latch 230 becomes a counter. Hence, when in the self-refresh mode, the bank address latch 230 is incremented periodically and used to cycle through the banks 210; and the row increment counter 220 is also incremented periodically which, in turn, increments the row address counter 250 containing the target row address for a row to be refreshed, thereby allowing rows to be cycled through in the banks 210.

When exiting the self-refresh mode, the volatile memory 110 internally resets or clears the row increment counter 220. This resynchronizes the volatile memory 110 and the memory controller 120 and ensures that the row represented by the current target row address will be refreshed in all the banks 210. By resetting the row increment counter 220, the volatile memory 110 ensures that the row address counter 250 is only incremented after the predetermined number of auto-refresh operations have been performed, which means that the row represented by the current target row address is refreshed in all the banks 210.

Also, the memory controller 120 issues a number of auto-refresh commands within one (1) average refresh period ($t_{REF1}$) after the volatile memory 110 exits the self-refresh mode. Since the memory controller 120 does not know which bank was last refreshed by the volatile memory 110 prior to exiting the self-refresh mode, these auto-refresh commands are used to ensure that all the banks 210 are refreshed within one (1) average refresh period ($t_{REF1}$), which conversely ensures that data integrity is maintained and no data is lost. The number of auto-refresh commands that are to be issued within one (1) average refresh period ($t_{REF1}$) depends on the number of banks 210 in the volatile memory 110. For example, the number of auto-refresh commands to be issued subsequent to the self-refresh mode exit is four (4) for the volatile memory 110 shown in FIG. 2. The average refresh period ($t_{REF1}$) may vary depending on a particular volatile memory. Based on the disclosure and teachings provided herein, a person of ordinary skill in the art will appreciate how to implement the row increment counter 220 and determine the appropriate number of auto-refresh commands to be issued after exit from self-refresh mode in accordance with the present disclosure.

It should be noted that issuing the auto-refresh commands within one (1) average refresh period ($t_{REF1}$) after exit from the self-refresh mode is optional, if the memory controller 120 implements a refresh-ahead scheme and is at least a number of refreshes ahead prior to entering the self-refresh mode. For example, with the volatile memory 110 as shown in FIG. 2, there is no need to issue the auto-refresh commands within one (1) average refresh period ($t_{REF1}$) after exit from the self-refresh mode if at least four (4) refreshes have been performed ahead prior to entering the self-refresh mode. A number of refresh-ahead schemes are known in the art. Based on the disclosure and teachings provided herein, a person of ordinary skill in the art will appreciate how to incorporate a refresh-ahead scheme for use in connection with the present disclosure.

The methods or algorithms described in connection with the embodiments disclosed herein may be embodied directly in hardware, in a software module executable by a processor, or in a combination of both, in the form of control logic, programming instructions, or other directions. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit of scope of the invention. Thus, the present invention is not intended to be limited to the embodiments shown herein, but is to be accorded the full scope consistent with the claims, wherein reference to an element in the singular is not intended to mean "one and only one" unless specifically so stated, but rather "one or more". All structural and functional equivalents to the elements of the various embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for".

What is claimed is:

1. A memory system, comprising:
    a volatile memory configured to operate in an auto-refresh mode and a self-refresh mode, the volatile memory including a plurality of banks, a bank address latch, and a single refresh counter; and
    a memory controller configured to provide a target bank address to each of the banks to perform an auto-refresh operation on the target bank, while the other banks remain available for access;
    wherein the memory controller is further configured to load the target bank address into the bank address latch each time an auto-refresh operation is performed, and wherein upon the volatile memory entering into the self-refresh mode, the volatile memory is further configured to generate a self-refresh using the last target bank address loaded into the bank address latch before entering into the self-refresh mode.

2. The memory system of claim 1 wherein the volatile memory is further configured to provide the target bank address in the bank address latch to each of the banks.

3. The memory system of claim 1 wherein the single refresh counter is configured to provide a row address to each of the banks.

4. The memory system of claim 3 wherein the refresh counter further comprises a row address counter configured to provide the row address to each of the banks and a row increment counter configured to control the row address counter.

5. The memory system of claim 4 wherein upon exiting the self-refresh mode and entering the auto-refresh mode, the volatile memory is further configured to reset the row increment counter to synchronize the volatile memory and the memory controller.

6. The memory system of claim 4 wherein the volatile memory further comprises a refresh trigger configured to control the row increment counter.

7. The memory system of claim 6 wherein the refresh trigger is further configured to increment the row increment counter each time an auto-refresh operation is performed.

8. The memory system of claim 7 wherein the row increment counter is further configured to increment the row address counter after a predetermined number of auto-refresh operations have been performed.

9. The memory system of claim 8 wherein the predetermined number is equal to the number of banks.

10. The memory system of claim 9 wherein the volatile memory is further configured to provide the target bank address in the bank address latch to each of the banks.

11. The memory system of claim 1 wherein the volatile memory is further configured to increment the target bank address in the bank address latch after each self-refresh operation.

12. A memory system, comprising:
    a volatile memory configured to operate in an auto-refresh mode and a self-refresh mode, the volatile memory including a plurality of banks, a bank address latch, and a single refresh counter configured to provide a row address to each of the banks during an auto-refresh operation; and
    a memory controller configured to direct the volatile memory to perform an auto-refresh operation on a target bank, while the other banks remain available for access;
    wherein the memory controller is further configured to load a target bank address into the bank address latch each time an auto-refresh operation is performed, and wherein upon the volatile memory entering into the self-refresh mode, the volatile memory is further configured to generate one or more self-refreshes using the last target bank address loaded into the bank address latch before entering into the self-refresh mode.

13. The memory system of claim 12 wherein the volatile memory is further configured to provide the target bank address in the bank address latch to each of the banks.

14. The memory system of claim 12 wherein the refresh counter further comprises a row address counter configured to provide the row address to each of the banks and a row increment counter configured to control the row address counter.

15. The memory system of claim 14 wherein upon exiting the self-refresh mode and entering the auto-refresh mode, the volatile memory is further configured to reset the row increment counter to synchronizing the volatile memory and the memory controller.

16. The memory system of claim 14 wherein the volatile memory further comprises a refresh trigger configured to control the row increment counter.

17. The memory system of claim 15 wherein the refresh trigger is further configured to increment the row increment counter each time an auto-refresh operation is performed.

18. The memory system of claim 16 wherein the row increment counter is further configured to increment the row address counter after a predetermined number of auto-refresh operations have been performed.

19. The memory system of claim 18 wherein the predetermined number is equal to the number of banks.

20. The memory system of claim 19 wherein the volatile memory is further configured to provide the target bank address in the bank address latch to each of the banks.

21. The memory system of claim 12 wherein the volatile memory is further configured to increment the target bank address in the bank address latch after each self-refresh operation.

22. A method of refreshing volatile memory, the method comprising:
providing a target bank address from a memory controller to each of the banks in a volatile memory, the volatile memory configured to operate in an auto-refresh mode and in a self-refresh mode, the volatile memory including a plurality of banks and a single refresh counter;
performing an auto-refresh operation on the target bank, while the other banks remain available for access by the memory controller; and
switching the volatile memory from the auto-refresh mode to the self-refresh mode, and using the target bank address of a previous auto-refresh operation in a self-refresh operation.

23. The method of claim 22, further comprising providing a row address to each of the banks, the auto-refresh operation being performed on the addressed row in the target bank.

24. The method of claim 23, further comprising providing a second target bank address to each of the banks, and performing a auto-refresh operation on the addressed row in the second target bank while the other banks remain available for access by the memory controller.

25. The method of claim 22, further comprising incrementing the target bank address for the next self-refresh operation.

* * * * *

UNITED STATES PATENT AND TRADEMARK OFFICE
CERTIFICATE OF CORRECTION

PATENT NO. : 7,586,805 B2  Page 1 of 1
APPLICATION NO. : 11/374838
DATED : September 8, 2009
INVENTOR(S) : Remaklus, Jr. et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 293 days.

Signed and Sealed this

Eighteenth Day of January, 2011

David J. Kappos
*Director of the United States Patent and Trademark Office*

UNITED STATES PATENT AND TRADEMARK OFFICE
CERTIFICATE OF CORRECTION

PATENT NO. : 7,586,805 B2
APPLICATION NO. : 11/374838
DATED : September 8, 2009
INVENTOR(S) : Remaklus et al.

It is certified that error appears in the above-identified patent and that said Letters Patent is hereby corrected as shown below:

Column 9, line 24, claim 17: "claim 15" to read as --claim 16--

Column 9, line 27, claim 18: "claim 16" to read as --claim 17--

Signed and Sealed this
Seventh Day of June, 2011

David J. Kappos
*Director of the United States Patent and Trademark Office*